United States Patent
Choi et al.

(10) Patent No.: US 7,301,186 B2
(45) Date of Patent: Nov. 27, 2007

(54) METAL OXIDE SEMICONDUCTOR TRANSISTOR AND METHOD FOR MANUFACTURING THE SAME

(75) Inventors: Jun-Gi Choi, Ichon-shi (KR); Hi-Hyun Han, Ichon-shi (KR)

(73) Assignee: Hynix Semiconductor, Inc., Ichon-shi (KR)

( * ) Notice: Subject to any disclaimer, the term of this patent is extended or adjusted under 35 U.S.C. 154(b) by 57 days.

(21) Appl. No.: 11/215,957

(22) Filed: Aug. 30, 2005

(65) Prior Publication Data
US 2006/0138560 A1   Jun. 29, 2006

(30) Foreign Application Priority Data
Dec. 28, 2004   (KR) .................. 10-2004-0113576

(51) Int. Cl.
*H01L 29/94* (2006.01)
(52) U.S. Cl. .................................................. 257/288
(58) Field of Classification Search ................ 257/288, 257/229, 272
See application file for complete search history.

(56) References Cited
U.S. PATENT DOCUMENTS

| | | | | |
|---|---|---|---|---|
| 5,933,039 A | * | 8/1999 | Hui et al. .................. 327/262 |
| 6,140,687 A | * | 10/2000 | Shimomura et al. ........ 257/401 |
| 6,768,143 B1 | * | 7/2004 | Fredeman et al. .......... 257/206 |

* cited by examiner

*Primary Examiner*—Kiesha Rose
(74) *Attorney, Agent, or Firm*—Townsend and Townsend and Crew LLP (57) ABSTRACT

A metal oxide semiconductor (MOS) transistor includes a source region having at least one source contact; a drain region having at least one drain contact; and a gate provided between the source region and the drain region, wherein the number of source contacts included in the source region is different from the number of drain contacts included in the source region.

12 Claims, 10 Drawing Sheets

(PRIOR ART)

| Temp.[°C] \ Source Contact# | 30 | 20 | 10 | 5 | 1 |
|---|---|---|---|---|---|
| -30 | 97.0 | 93.9 | 85.8 | 73.5 | 36.3 |
| -10 | 92.1 | 89.3 | 81.9 | 70.7 | 35.7 |
| 25 | 84.8 | 82.4 | 76.2 | 66.6 | 34.9 |
| 85 | 75.0 | 73.3 | 68.6 | 61.0 | 34.0 |
| 125 | 70.0 | 68.5 | 64.6 | 58.1 | 33.8 |
| Max-Min | 27.0 | 25.3 | 21.2 | 15.4 | 2.5 |

FIG. 6B

| Temp.[°C] \ Source Contact# | 30 | 20 | 10 | 5 | 1 |
|---|---|---|---|---|---|
| -30 | 38.5 | 37.8 | 35.7 | 32.3 | 19.1 |
| -10 | 38.5 | 37.7 | 35.6 | 32.2 | 19.2 |
| 25 | 38.3 | 37.6 | 35.5 | 32.2 | 19.2 |
| 85 | 38.0 | 37.3 | 35.2 | 31.9 | 19.1 |
| 125 | 37.5 | 36.9 | 34.8 | 31.5 | 18.9 |
| Max-Min | 1.0 | 0.9 | 0.8 | 0.7 | 0.3 |

METAL OXIDE SEMICONDUCTOR TRANSISTOR AND METHOD FOR MANUFACTURING THE SAME

CROSS-REFERENCES TO RELATED APPLICATIONS

The present application claims priority to Korean Application No. 10-2004-0113576, filed on Dec. 28, 2004, which is incorporated by reference.

BACKGROUND OF THE INVENTION

The present invention relates to a semiconductor device; and, more particularly, to a metal oxide semiconductor (MOS) transistor capable of preventing a saturation current variation.

Generally, a saturation current generated between a source and a drain of a metal oxide semiconductor (MOS) transistor is varied due to a temperature variation. That is, characteristics of an integrated circuit, such as a constant voltage generation circuit or a delay circuit, including the MOS transistor are changed due to the temperature variation. If the characteristics of the integrated circuit are excessively changed based on predetermined conditions such as temperature and pressure, the integrated circuit may not be normally operated.

Accordingly, during manufacturing steps, integrated circuits are tested at a severe temperature, e.g., −10° C. or 90° C., in order to screen out a defective circuit. Since the defective circuit cannot be used by users, it is desirable to produce a MOS transistor stably operated regardless of the temperature variation.

Figure 1:
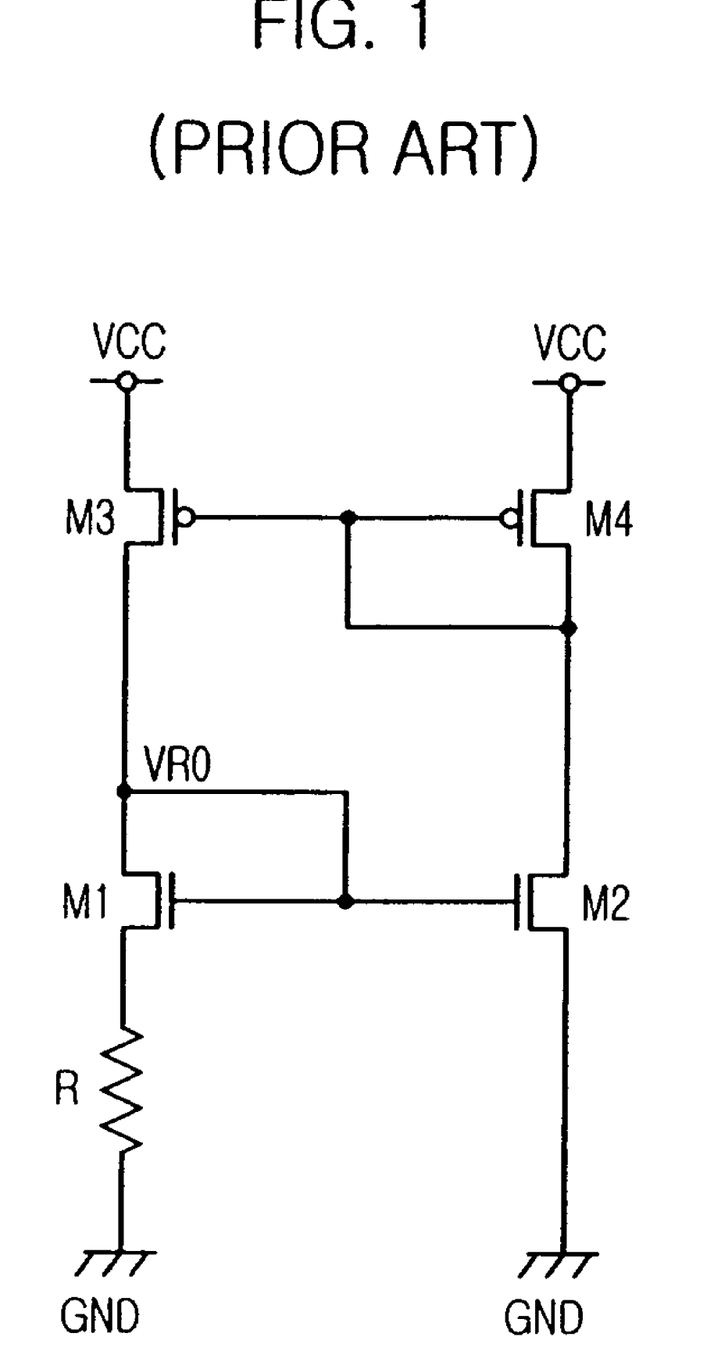
FIG. 1 is a schematic circuit diagram showing a conventional constant voltage generation circuit.

FIG. 1 is a schematic circuit diagram showing a conventional constant voltage generation circuit including conventional MOS transistors.

As shown, the conventional constant voltage generation circuit includes a first and a second n-type metal oxide semiconductor (NMOS) transistors M1 and M2; a first and a second p-type metal oxide semiconductor (PMOS) transistors M3 and M4; and a resistor R.

A source of the second NMOS transistor M2 is coupled to a ground GND. A gate of the second NMOS transistor M2 is coupled to a gate of the first NMOS transistor M1. The gate of the first NMOS transistor M1 is also coupled to a drain of the first NMOS transistor M1. A source of the first NMOS transistor M1 is coupled to a first terminal of the resistor R and a second terminal of the resistor R is connected to the ground GND.

Each source of the first PMOS transistor M3 and the second PMOS transistor M4 is connected to a power supply voltage VCC. Each gate of the first PMOS transistor M3 and the second PMOS transistor M4 is coupled to each other. A drain of the first PMOS transistor M3 and a drain of the second PMOS transistor M4 are respectively coupled to the drain of the first NMOS transistor M1 and the drain of the second NMOS transistor M4.

The first and the second PMOS transistors M3 and M4 are served as a current mirror circuit for operating the first and the second NMOS transistors M1 and M2. The MOS transistors M1 to M4 shown in FIG. 1 are served as a Widlar-type current mirror circuit for generating a constant voltage VR0.

Herein, it is noted that the resistor R is connected between the first NMOS transistor M1 and the ground GND. A role of the resistor R is described below.

Figure 2:
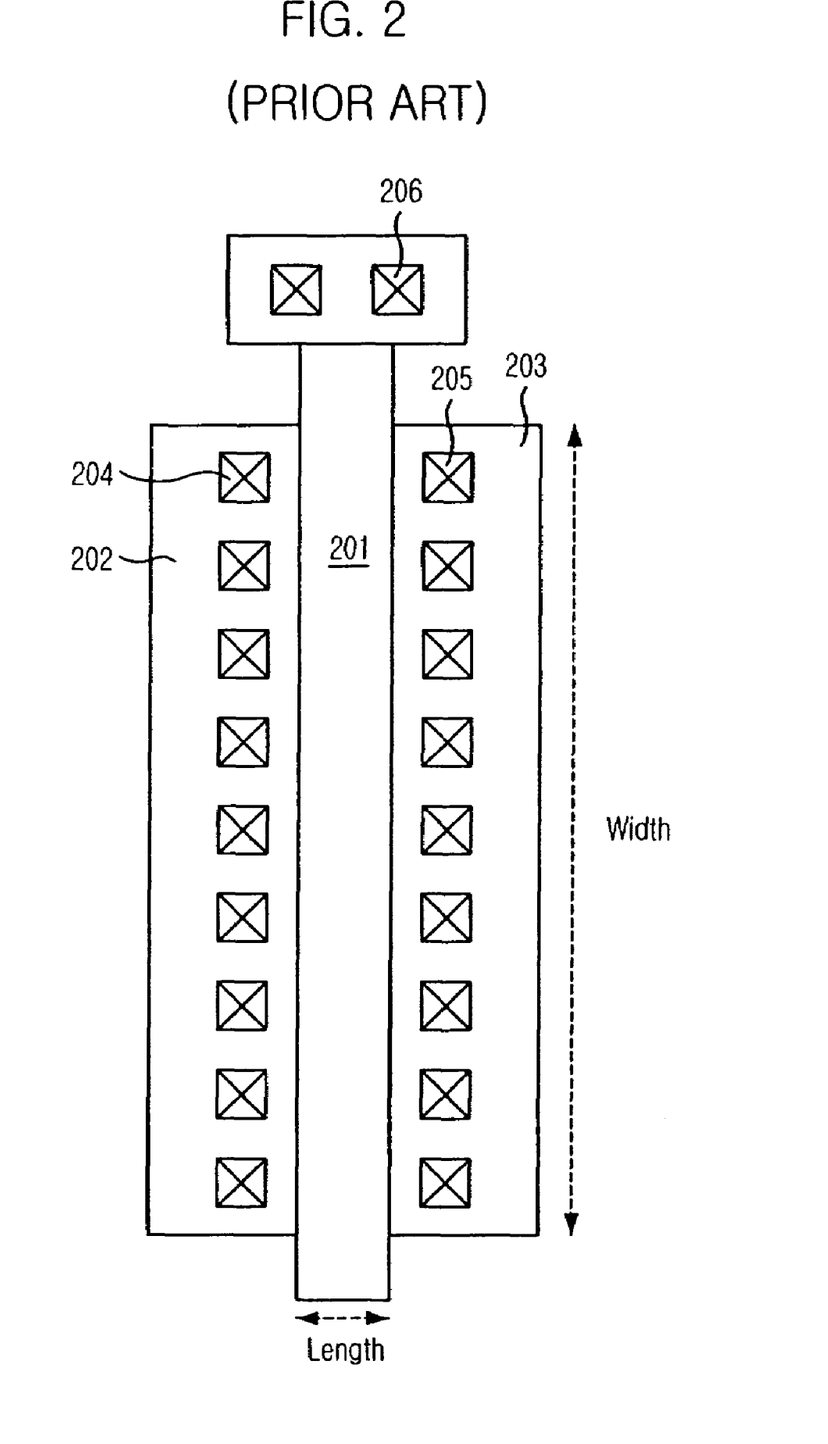
FIG. 2 is a lay-out of a MOS transistor included in the conventional constant voltage generation circuit shown in FIG. 1.

FIG. 2 is a lay-out of each MOS transistor, e.g., M1, included in the conventional constant voltage generation circuit shown in FIG. 1.

As shown, the first NMOS transistor M1 includes a gate line 201, a source region 202 and a drain region 203.

Each of the source region 202 and the drain region 203 includes a plurality of contacts, e.g., a contact 204 included in the source region 202 and a contact 205 included in the drain region 203, for supplying a power and connecting internal elements. The gate line 201 also includes contacts, e.g., 206. Herein, it is noted that the number of contacts included in the source region 202 is same to the number of contacts included in the drain region 203.

Further, a size of the first NMOS transistor M1 is determined by a ratio of width to length. The length corresponds to a distance between the source region 202 and the drain region 203, and the width corresponds to a length of a tangent line between the gate line 201 and the source region 202 or the drain region 203.

Meanwhile, as above-mentioned, a saturation current of a conventional MOS transistor having a structure such as the lay-out shown in FIG. 2 can be abnormally changed due to the unstable temperature. Accordingly, the conventional constant voltage generation circuit having the conventional MOS transistor can operate abnormally.

Therefore, for compensating the change of the performance of the above constant voltage generation circuit, it is necessary that the resistor R is connected between the first NMOS transistor M1 and the ground GND. That is, for reducing the change of the characteristics caused by the temperature variation, the resistance of the resistor R and the size of the first NMOS transistor M1 are appropriately adjusted.

BRIEF SUMMARY OF THE INVENTION

Embodiments of the present invention relate to providing a metal oxide semiconductor (MOS) transistor which is capable of stably operating in response to a temperature variation.

In one embodiment of the present invention, a metal oxide semiconductor (MOS) transistor includes a source region having at least one source contact; a drain region having at least one drain contact; and a gate, which is connected between the source region and the drain region, wherein the number of source contacts included in the source region is different from the number of drain contacts included in the source region.

In another embodiment of the present invention, there is provided a constant voltage generation circuit, including: a first MOS transistor for receiving a power supply voltage; a second MOS transistor for receiving the power supply voltage, a gate of the second MOS transistor being coupled to a gate of the first MOS transistor; a third MOS transistor connected between the first MOS transistor and a ground; and a fourth MOS transistor connected between the second MOS transistor and the ground, a gate of the third MOS transistor being coupled to a gate of the fourth MOS transistor, wherein each MOS transistor includes a source region having at least one source contact, a drain region having at least one drain contact and a gate, the number of source contacts included in the source region being different from the number of drain contacts included in the drain region.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a metal oxide semiconductor (MOS) transistor in accordance with the present invention will be described in detail referring to the accompanying drawings.

Figure 3:
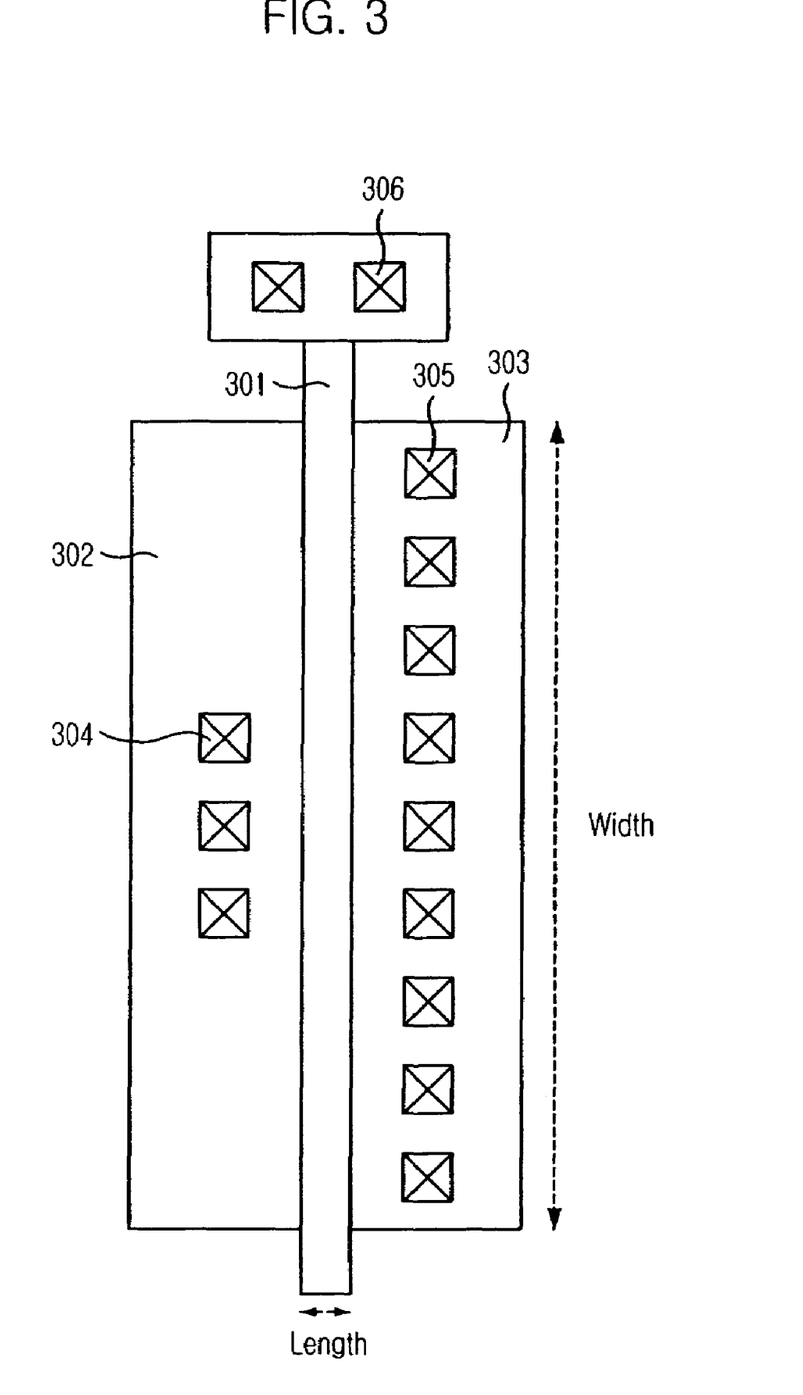
FIG. 3 is a lay-out showing a MOS transistor in accordance with a preferred embodiment of the present invention.

FIG. 3 is a diagram showing a lay-out of a MOS transistor in accordance with a preferred embodiment of the present invention.

As shown, the MOS transistor includes a gate line 301, a source region 302 and a drain region 303. Each of the source region 302 and the drain region 303 includes at least one contact, e.g., 304 included in the source region 302 and 305 included in the drain region 303, for supplying a power and connecting internal elements.

A size of the MOS transistor is determined by a ratio of width to length as shown in FIG. 3.

Herein, in comparison with the conventional MOS transistor, the number of contacts included in the source region 302 is smaller than the number of contacts included in the drain region 303. Further, the length is smaller than that of the conventional MOS transistor.

As the number of contacts of the source region 302 is decreased, the source contact resistance is increased. Since the source contact resistance is increased, the source contact resistance is relatively more sensitive to a temperature variation. That is, a change of characteristics of the MOS transistor caused by the temperature variation is compensated by a change of the source contact resistance. Herein, although a current flow is decreased as the source contact resistance is increased, the current reduction is compensated by decreasing the length.

Figure 4A:
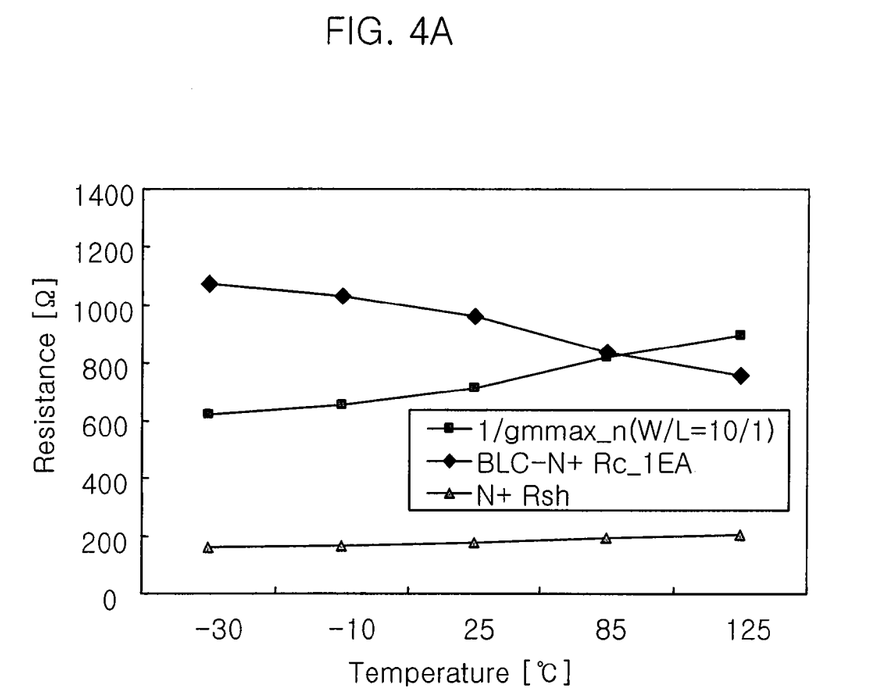
FIG. 4A is a graph demonstrating a first simulation result of resistance characteristics of an NMOS transistor in accordance with the preferred embodiment of the present invention.

FIG. 4A is a graph demonstrating a first simulation result of resistance characteristics of an n-type metal oxide semiconductor (NMOS) transistor in accordance with the preferred embodiment of the present invention when the temperature is variously changed.

Herein, it is assumed that a ratio of width to length, i.e., W/L, is 10/1. A channel resistance is marked as "1/gmmax_n (W/L=10/1)" and a source contact resistance is marked as "BLC-N+Rc__1EA". The source contact resistance 1/gmmax_n(W/L=10/1) shows a resistance of one source contact. A resistance of a source region is marked as "N+Rsh".

Figure 4B:
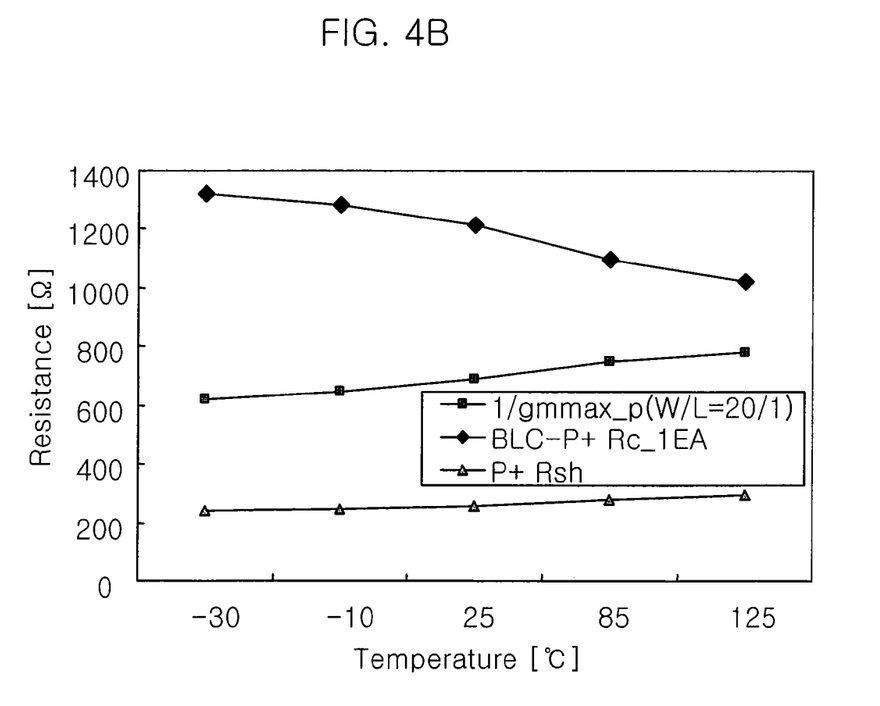
FIG. 4B is a graph demonstrating a second simulation result of resistance characteristics of a PMOS transistor in accordance with the preferred embodiment of the present invention.

FIG. 4B is a graph demonstrating a second simulation result of resistance characteristics of a p-type metal oxide semiconductor (PMOS) transistor in accordance with the preferred embodiment of the present invention when the temperature is variously changed.

Herein, it is assumed that a ratio of width to length, i.e., W/L, is 20/1. A channel resistance is marked as "1/gmmax_p (W/L=20/1)" and a source contact resistance is marked as "BLC-P+Rc__1EA". The source contact resistance 1/gmmax_p(W/L=20/1) shows a resistance of one source contact. A resistance of a source region is marked as "P+Rsh".

Referring to FIGS. 4A and 4B, each source contact resistance of the NMOS transistor and the PMOS transistor is decreased as the temperature is increased.

Figure 5A:
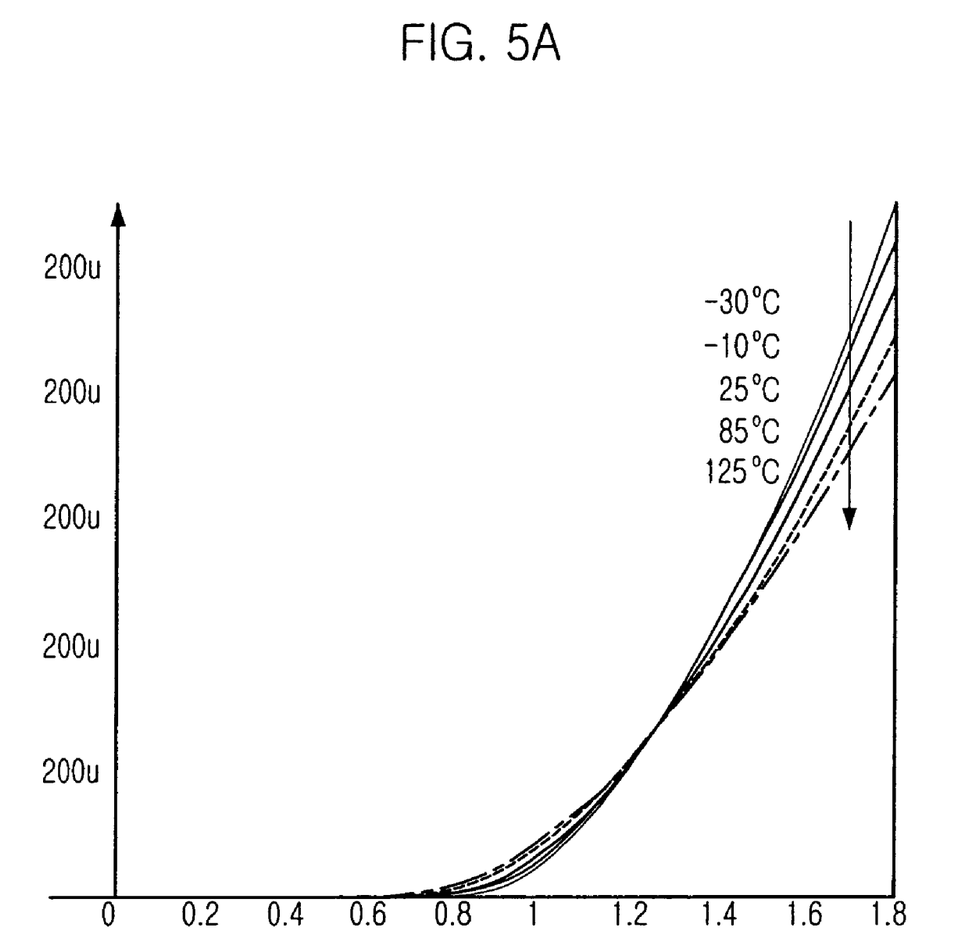
FIG. 5A is a graph demonstrating a third simulation result of a source-drain current and a gate-source voltage of the NMOS transistor shown in FIG. 4A.

FIG. 5A is a graph demonstrating a third simulation result of a source-drain current Id and a gate-source voltage Vgs of the NMOS transistor when the temperature is changed.

As shown, the source-drain current Id is decreased as the temperature is increased at the gate-source voltage Vgs.

Figure 5B:
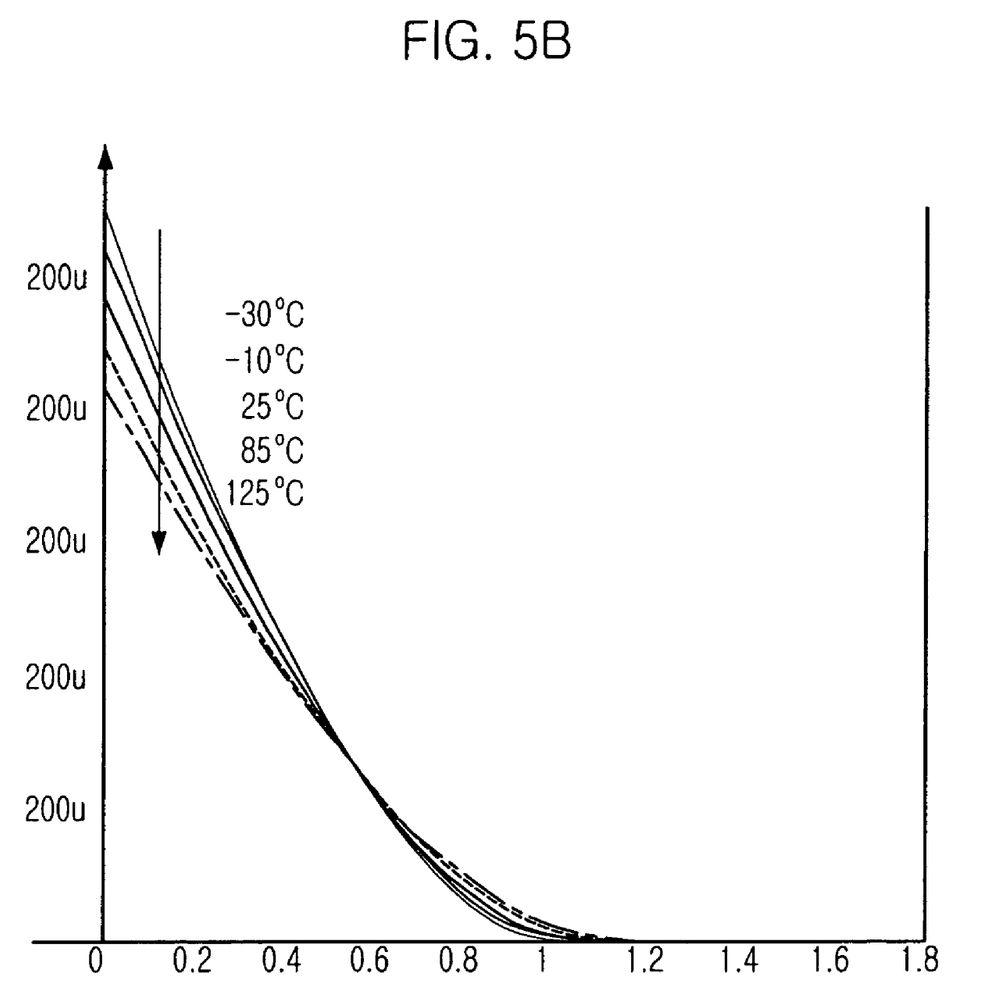
FIG. 5B is a graph demonstrating a fourth simulation result of a source-drain current and a gate-source voltage of the PMOS transistor shown in FIG. 4B.

FIG. 5B is a graph demonstrating a fourth simulation result of a source-drain current Id and a gate-source voltage Vgs of the PMOS transistor when the temperature is changed.

As shown, the source-drain current Id is decreased as the temperature is increased at the gate-source voltage Vgs.

Referring to FIGS. 4A to 5B, a saturation current variation and a source contact variation caused by the temperature variation can be understood. By appropriately adjusting the number of source contacts based on the data, the saturation current variation caused by the temperature variation can be compensated.

Figure 6A:
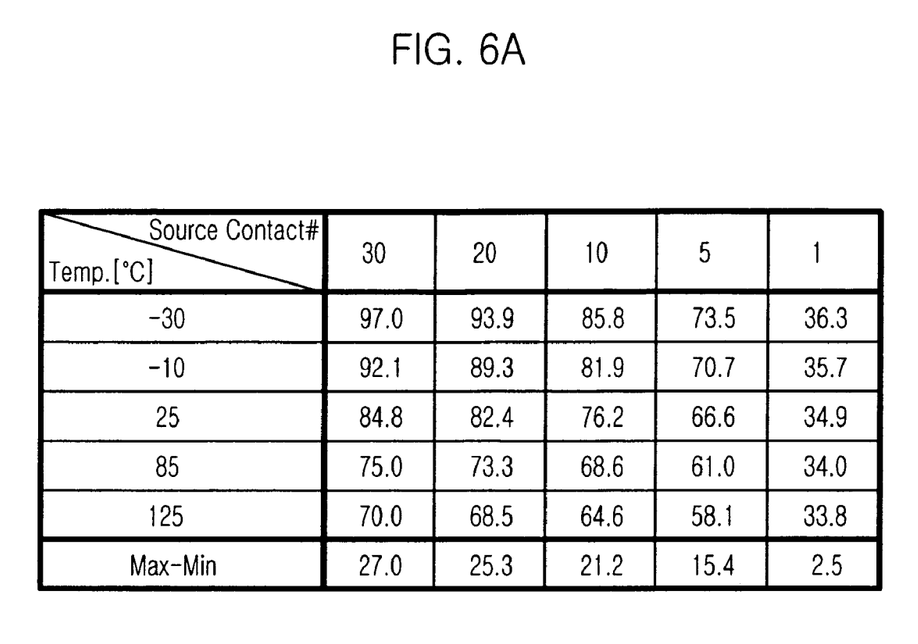
FIG. 6A is a table showing a fifth simulation result of a saturation current variation of the NMOS transistor shown in FIG. 4A.

FIG. 6A is a table showing a fifth simulation result of a saturation current variation of the NMOS transistor according to the number of source contacts and the temperature variation.

As shown, if the number of the source contacts is 30, the saturation current variation between a maximum temperature and a minimum temperature is 27 µA. However, if the number of the source contacts is 1, the saturation current variation between the maximum temperature and the minimum temperature is 2.5 µA.

Figure 6B:
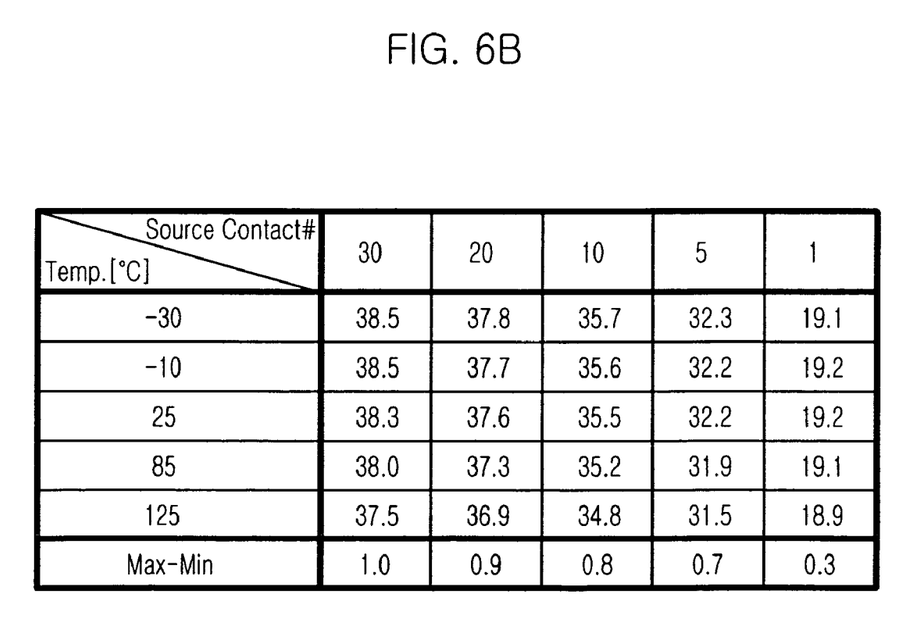
FIG. 6B is a table showing a sixth simulation result of a saturation current variation of the PMOS transistor shown in FIG. 4B.

FIG. 6B is a table showing a sixth simulation result of a saturation current variation of the PMOS transistor according to the number of source contacts and the temperature variation.

As shown, if the number of the source contacts is 30, the saturation current variation between a maximum temperature and a minimum temperature is 1.0 µA. However, if the number of the source contacts is 1, the saturation current variation between the maximum temperature and the minimum temperature is 0.3 µA.

Figure 7A:
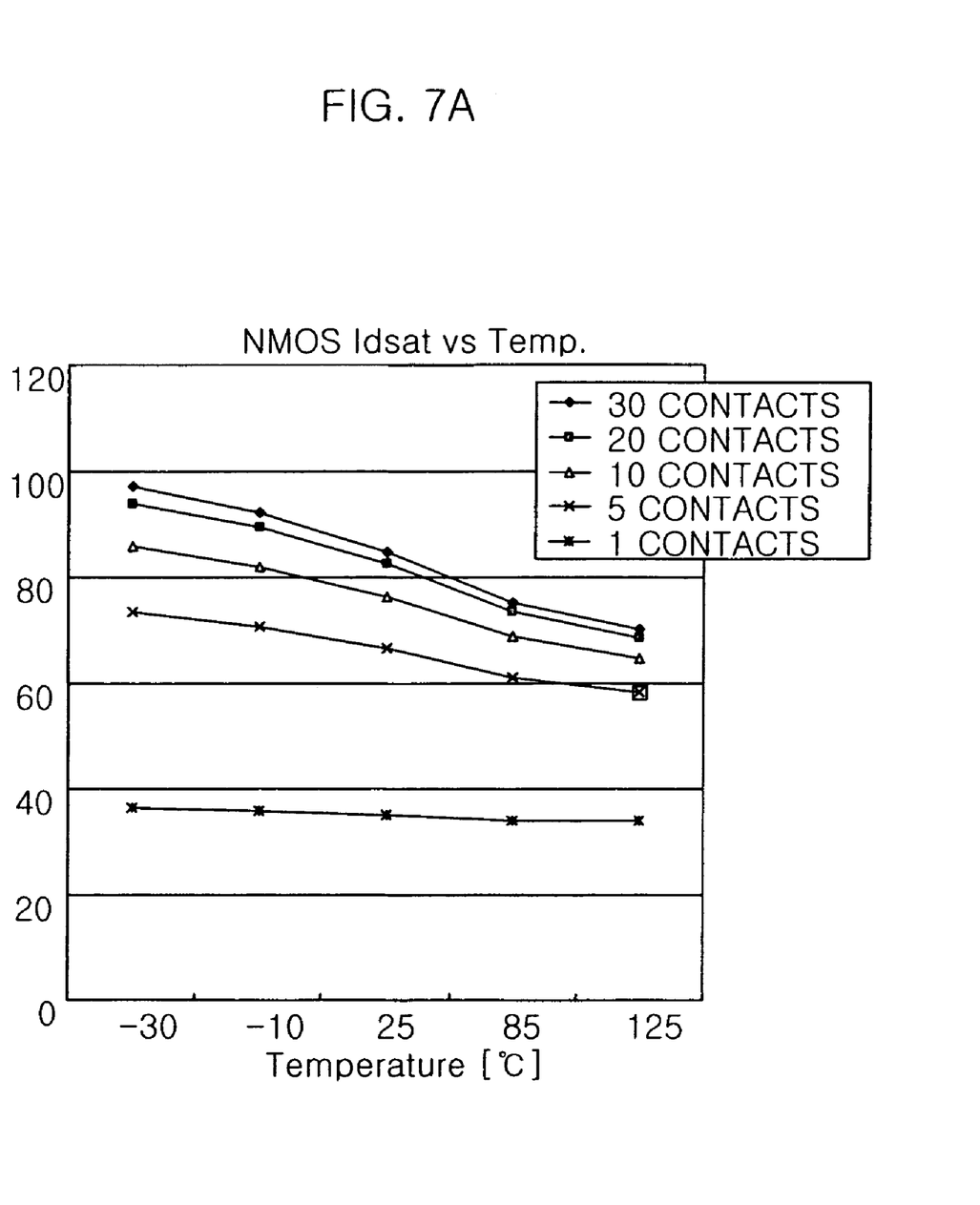
FIGS. 7A and 7B are graphs respectively showing simulated results shown in FIGS. 6A and 6B.
Figure 7B:
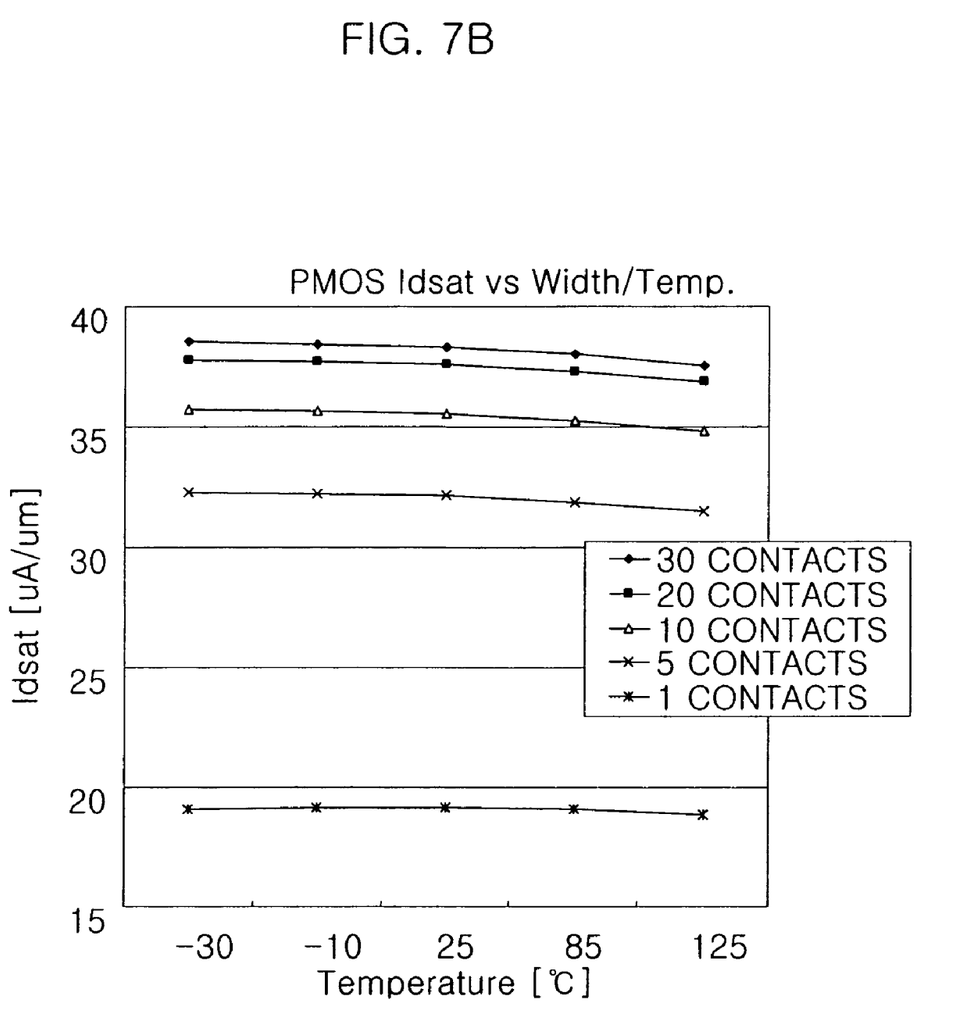

FIGS. 7A and 7B are graphs respectively showing simulation results shown in FIGS. 6A and 6B. As shown, each saturation current variation (Idsat) according to the temperature variation is decreased as the number of source contacts is decreased.

Figure 8:
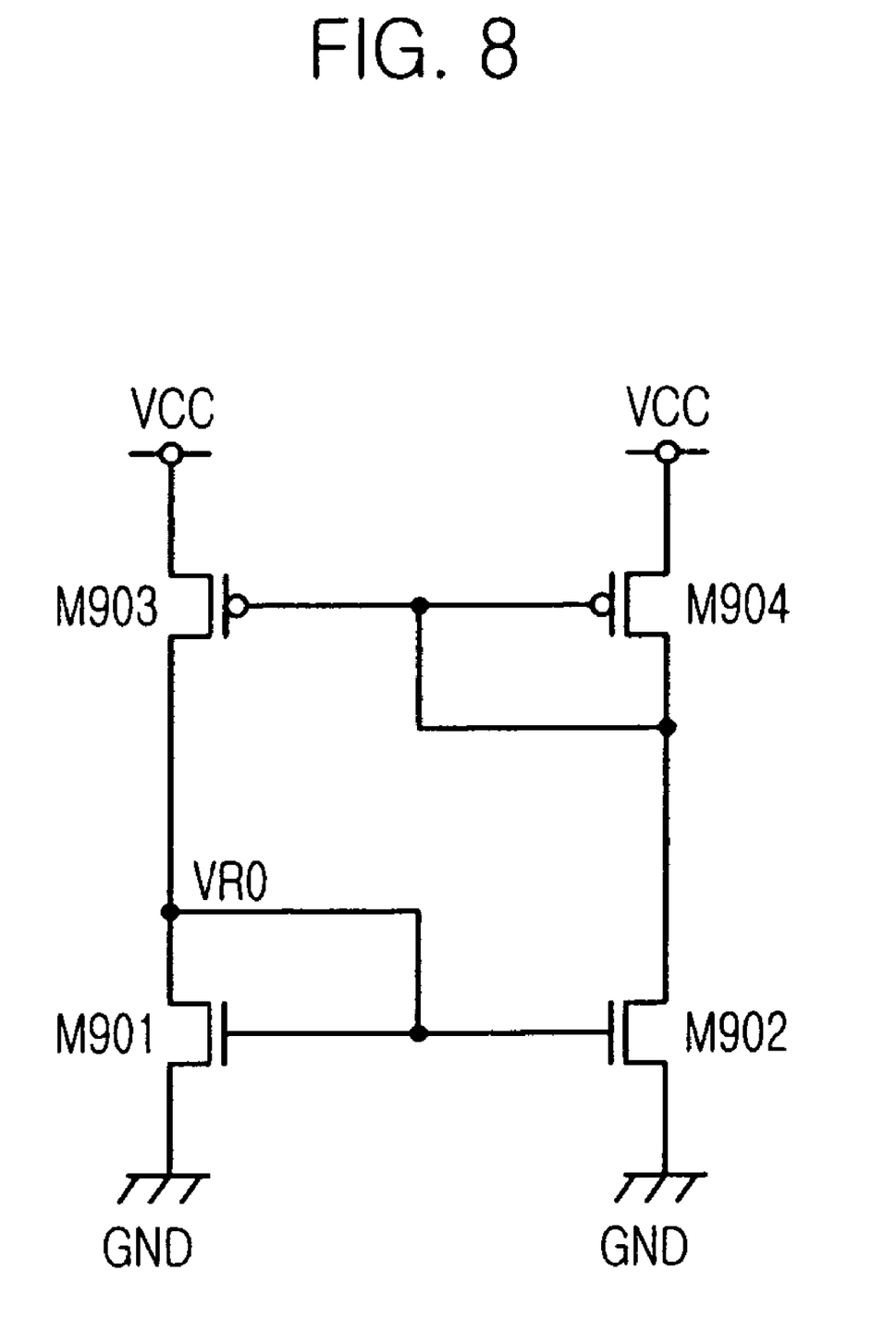
FIG. 8 is a schematic circuit diagram showing a constant voltage generation circuit in accordance with the present invention.

FIG. 8 is a schematic circuit diagram showing a constant voltage generation circuit in accordance with the present invention.

As shown, the constant voltage generation circuit includes a first NMOS transistor M901, a second NMOS transistor M902, a first PMOS transistor M903 and a second PMOS transistor M904. Herein, the number of source contacts included in each MOS transistor of the constant voltage generation circuit is appropriately determined for compensating a saturation current variation between a source and a drain caused by a temperature variation. Each MOS transistor included in the constant voltage generation circuit has a lay-out shown in FIG. 3.

In detail, a source of the first PMOS transistor M903 is coupled to a power supply voltage VCC and a gate of the first PMOS transistor M903 is coupled to a gate of the second PMOS transistor M904. Similarly, a source of the second PMOS transistor M904 is coupled to the power supply voltage VCC. The gate and the drain of the second PMOS transistor M904 are coupled each other.

A drain of the first NMOS transistor M901 is coupled to the drain of the first PMOS transistor M903 and a source of the first NMOS transistor M901 is coupled to a ground GND. The drain and the gate of the first NMOS transistor M901 are coupled each other. Similarly, a drain of the second NMOS transistor M903 is coupled to the drain of the second PMOS transistor M904 and a source of the second NMOS transistor M903 is coupled to the ground GND.

A constant voltage VR0 is generated at a node commonly coupled by the drain of the first NMOS transistor M901 and the drain of the first PMOS transistor M903.

As a result, by determining the number of source contacts included in each MOS transistor of the constant voltage generation circuit for compensating the saturation current, the constant voltage VR0 can be stably generated not using a temperature variation compensating resistor, e.g., R shown in FIG. 1.

The MOS transistor in accordance with the present invention can be used not only for a constant voltage generation circuit but also for other integrated circuits.

Accordingly, in accordance with the present invention, it is possible to reduce the number of defective integrated circuits, whereby a cost of production can be reduced.

The present application contains subject matter related to Korean patent application No. 2004-113576, filed in the Korean Patent Office on Dec. 28, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A metal oxide semiconductor (MOS) transistor, comprising:
   a source region having at least one source contact;
   a drain region having at least one drain contact; and
   a gate provided between the source region and the drain region,
   wherein the number of source contacts included in the source region is different from the number of drain contacts included in the source region, the number of the source contacts being determined based on a relation between a saturation current variation caused by a temperature variation and the number of the source contacts.

2. The MOS transistor as recited in claim 1, wherein the source region is provided with a given number of the source contacts to increase a source contact resistance.

3. The MOS transistor as recited in claim 2, wherein the number of the source contacts is smaller than the number of the drain contacts.

4. The MOS transistor as recited in claim 3, wherein a ratio of width to length of the MOS transistor is determined to compensate the increased source contact resistance.

5. The MOS transistor as recited in claim 1, wherein the saturation current variation is decreased as the number of the source contacts is decreased.

6. A constant voltage generation circuit, comprising: a first MOS transistor for receiving a power supply voltage; a second MOS transistor for receiving the power supply voltage, a gate of the second MOS transistor being coupled to a gate of the first MOS transistor; a third MOS transistor provided between the first MOS transistor and a ground; and a fourth MOS transistor provided between the second MOS transistor and the ground, a gate of the third MOS transistor being coupled to a gate of the fourth MOS transistor, wherein each MOS transistor includes a source region having at least one source contact, a drain region having at least one drain contact and a gate, the number of source contacts included in the source region being different from the number of drain contacts included in the drain region and the number of the source contacts being determined based on a relation between a saturation current variation caused by a temperurture variation and the number of source contacts.

7. The constant voltage generation circuit as recited in claim 6, wherein the source region is provided with a number of the source contacts to increase a source contact resistance.

8. The constant voltage generation circuit as recited in claim 7, wherein the number of the source contacts is smaller than the number of the drain contacts.

9. The constant voltage generation circuit as recited in claim 8, wherein each MOS transistor has width and length, the length corresponding to a distance between the source region and the drain region and the width corresponding to length of a tangent line between the gate and the source region or the drain region.

10. The constant voltage generation circuit as recited in claim 9, wherein a ratio of the width to the length is determined to compensate the increased source contact resistance.

11. The constant voltage generation circuit as recited in claim 6, wherein the number of the source contacts is selected based on a relation between a saturation current variation caused by a temperature variation and the number of the source contacts.

12. The constant voltage generation circuit as recited in claim 11, wherein the saturation current variation is decreased as the number of the source contacts is decreased.

* * * * *